(12) United States Patent
Wang et al.

(10) Patent No.: US 10,643,842 B2
(45) Date of Patent: May 5, 2020

(54) METHOD FOR MAKING PATTERNED 2D TRANSITION METAL DICHALCOGENIDES NANOMATERIALS

(71) Applicants: Tsinghua University, Beijing (CN); HON HAI PRECISION INDUSTRY CO., LTD., New Taipei (CN)

(72) Inventors: Xue-Wen Wang, Beijing (CN); Kai Liu, Beijing (CN); Ji-Wei Hou, Beijing (CN); Sheng-Zhe Hong, New Taipei (TW)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 82 days.

(21) Appl. No.: 16/165,804

(22) Filed: Oct. 19, 2018

(65) Prior Publication Data
US 2019/0228966 A1   Jul. 25, 2019

(30) Foreign Application Priority Data

Jan. 20, 2018   (CN) .......................... 2018 1 0056222

(51) Int. Cl.
*H01L 21/02*   (2006.01)
*H01L 21/306*   (2006.01)

(52) U.S. Cl.
CPC .... *H01L 21/02568* (2013.01); *H01L 21/0242* (2013.01); *H01L 21/02488* (2013.01); *H01L 21/02494* (2013.01); *H01L 21/02664* (2013.01); *H01L 21/306* (2013.01); *H01L 21/0259* (2013.01); *H01L 21/02658* (2013.01)

(58) Field of Classification Search
CPC ......... H01L 21/02568; H01L 21/02645; H01L 29/267; H01L 21/02658
See application file for complete search history.

(56) References Cited

U.S. PATENT DOCUMENTS

| | | | |
|---|---|---|---|
| 2012/0141799 A1* | 6/2012 | Kub | B28Y 30/00 428/408 |
| 2016/0240719 A1* | 8/2016 | Lin | H01L 21/0262 |
| 2017/0170260 A1* | 6/2017 | Dresselhaus | H01L 29/068 |
| 2019/0043720 A1* | 2/2019 | Liao | H01L 21/02063 |
| 2019/0131129 A1* | 5/2019 | Stinaff | H01L 21/02491 |

* cited by examiner

*Primary Examiner* — Jaehwan Oh
(74) *Attorney, Agent, or Firm* — ScienBiziP, P.C.

(57) ABSTRACT

A method for making patterned two dimensional (2D) transition metal dichalcogenides (TMDs) nanomaterials is disclosed. The method includes making a substrate, wherein the substrate has a substrate surface including a first portion surface and a second portion surface, the first portion surface is formed by oxide or nitride, and the second portion surface is formed by mica; applying a mono 2D TMDs nanomaterials; annealing the mono 2D TMDs nanomaterials and the substrate in an oxygen containing gas, the annealing temperature is controlled so that only the part of the 2D TMDs nanomaterials, that is on the second portion surface, is removed by oxidization, and the other part of the 2D TMDs nanomaterials, that is on the first portion surface, is remained to form the patterned 2D TMDs nanomaterials.

20 Claims, 24 Drawing Sheets

METHOD FOR MAKING PATTERNED 2D TRANSITION METAL DICHALCOGENIDES NANOMATERIALS

CROSS-REFERENCE TO RELATED APPLICATIONS

This application claims all benefits accruing under 35 U.S.C. § 119 from China Patent Application No. 201810056222.3, filed on Jan. 20, 2018, in the China Intellectual Property Office, the disclosure of which is incorporated herein by reference.

BACKGROUND

1. Technical Field

The present disclosure relates to nanotechnology, especially, to a method for making patterned two dimensional (2D) transition metal dichalcogenides (TMDs) nanomaterials.

2. Description of Related Art

TMDs with the chemical formula $MX_2$ (M=Mo, W and X=S, Se, Te) have a layered structure with relatively weak interlayer coupling akin to graphite, and can be isolated to monolayers from its bulk counterparts using mechanical exfoliation. TMDs are widely used in electronic devices because of their excellent semiconductor properties. TMDs can be molybdenum disulfide ($MoS_2$), tungsten disulfide ($WS_2$), molybdenum selenide ($MoSe_2$), tungsten diselenide ($WSe_2$), molybdenum telluride ($MoTe_2$) or tungsten telluride ($WTe_2$).

A method for patterning the TMDs, such as $MoS_2$, usually includes photolithography. However, the photolithography requires a specific device and a mask. Furthermore, the mask has to be removed for obtaining the patterned $MoS_2$. Thus, the method for patterning the TMDs is complicated and expensive.

There is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
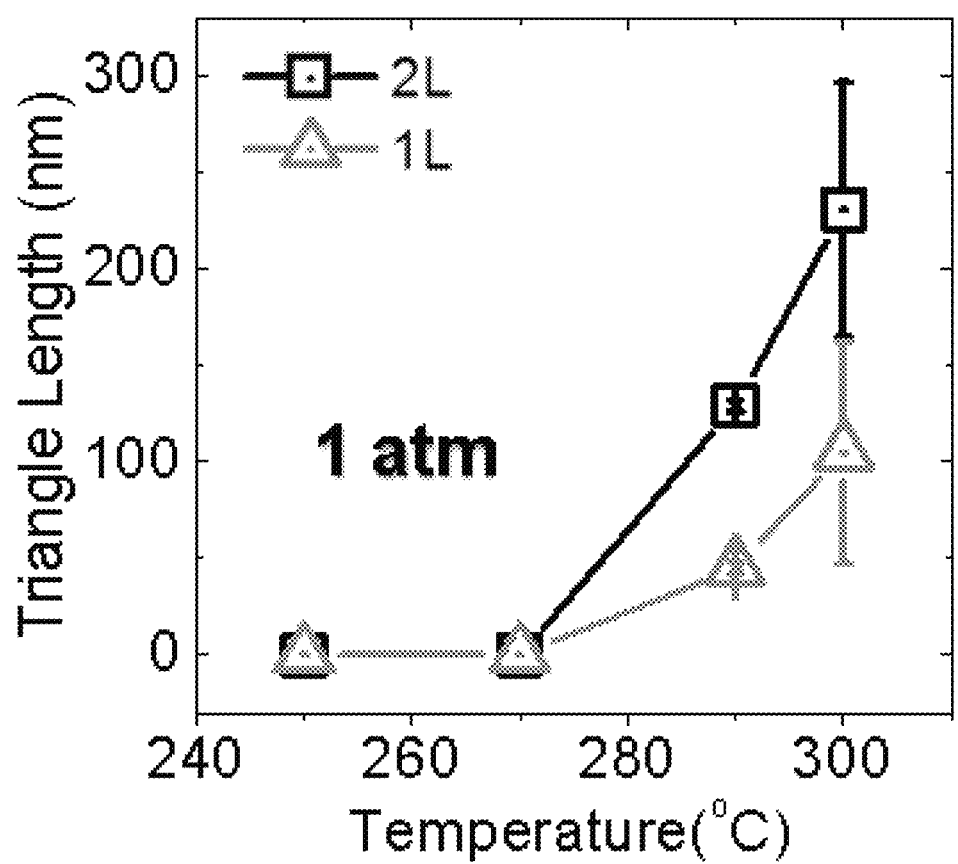
FIG. 1 shows the relationship between the triangle length and the annealing temperature of the 1-layer $MoS_2$ and the 2-layer $MoS_2$ on the silicon dioxide substrate.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated better illustrate details and features. The description is not to considered as limiting the scope of the embodiments described herein.

Several definitions that apply throughout this disclosure will now be presented. The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

References will now be made to the drawings to describe, in detail, various embodiments of the present methods for making patterned 2D TMDs nanomaterials.

The inventors of instant application found that the different substrate materials result different thermal stabilities of the 2D TMDs nanomaterials, such as the $MoS_2$. A first $MoS_2$ sample is transferred on a surface of the silicon dioxide ($SiO_2$) substrate. A second $MoS_2$ sample is transferred on a surface of the sapphire ($Al_2O_3$) substrate. A third $MoS_2$ sample is transferred on a surface of the quartz substrate. A fourth $MoS_2$ sample is transferred on a surface of the mica substrate. Each $MoS_2$ sample may include a single $MoS_2$ sheet, two stacked $MoS_2$ sheets, three stacked $MoS_2$ sheets, and four stacked $MoS_2$ sheets. The single $MoS_2$ sheet, two stacked $MoS_2$ sheets, three stacked $MoS_2$ sheets, and four stacked $MoS_2$ sheets are respectively defined as 1-layer $MoS_2$, 2-layer $MoS_2$, 3-layer $MoS_2$, and 4-layer $MoS_2$, and represented by 1L, 2L, 3L, and 4L in FIGS. Each $MoS_2$ sample is annealed in a tube furnace filled with air at a temperature of 240° C.~350° C. with a temperature rise rate of 20° C./minute. After annealing, some triangle through holes are formed on the $MoS_2$ samples by oxidation etching.

Figure 2:
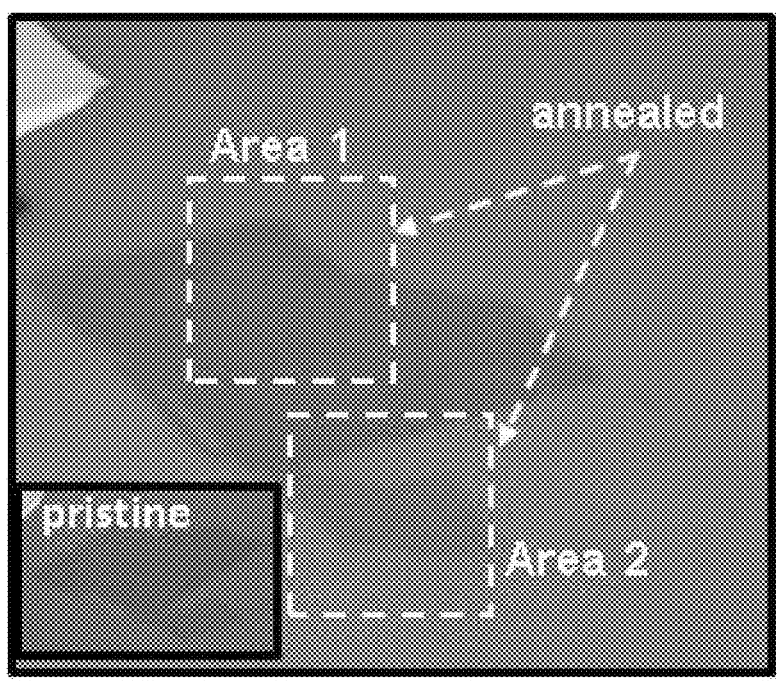
FIG. 2 shows optical photos of the pristine $MoS_2$ sample on the silicon dioxide substrate before annealing, and the annealed $MoS_2$ sample on the silicon dioxide substrate after annealing at 290° C.
Figure 3:
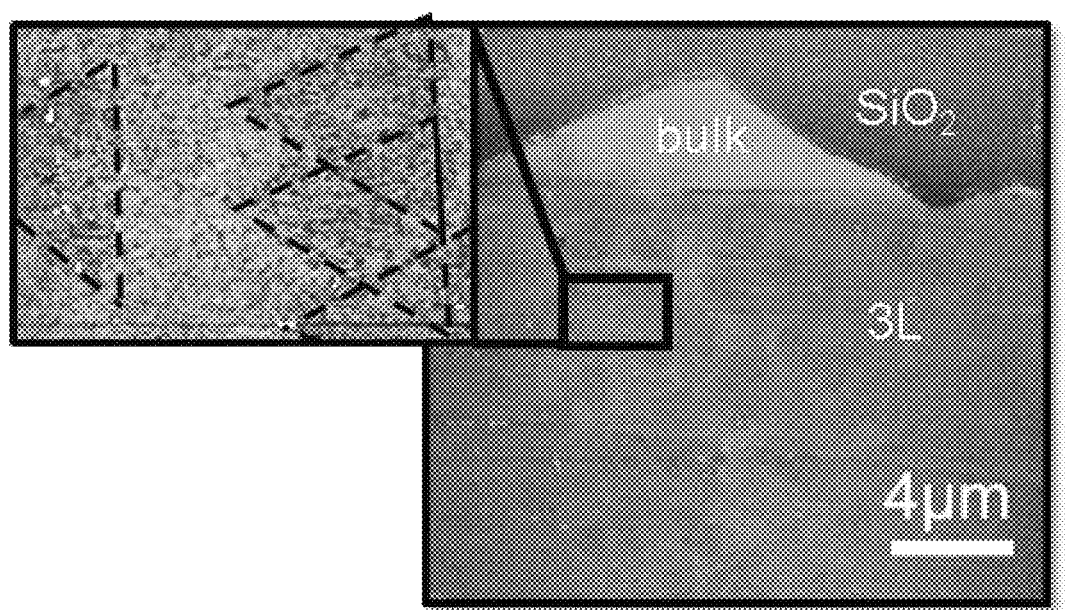
FIG. 3 shows an atomic force microscope topography of the area 1 of FIG. 2.
Figure 4:
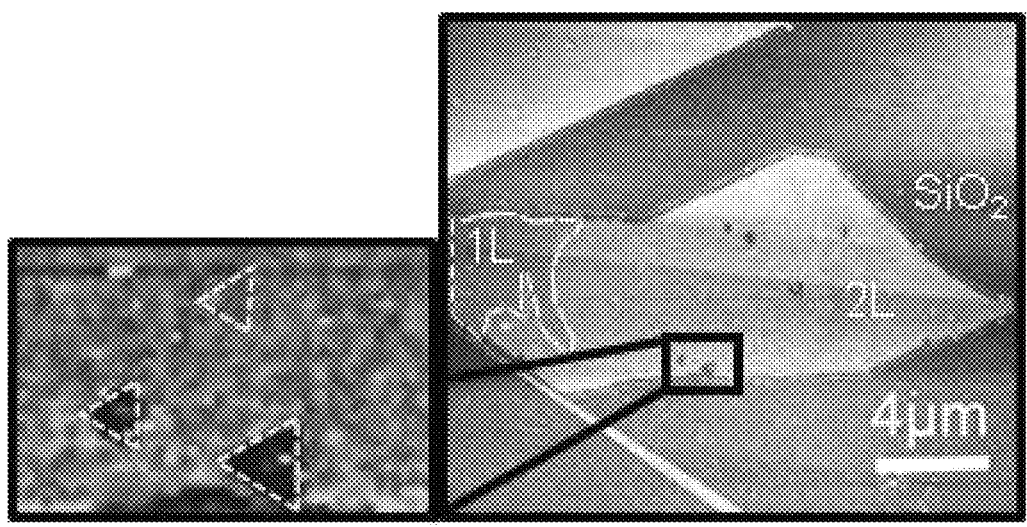
FIG. 4 shows an atomic force microscope topography of the area 2 of FIG. 2.

FIG. 1 shows the relationship between the triangle length and the annealing temperature of the 1-layer $MoS_2$ and the 2-layer $MoS_2$ on the silicon dioxide substrate. It is found that, at atmospheric pressure, the 1-layer $MoS_2$ on the silicon dioxide substrate is almost not etched before 270° C., gradually etched after 270° C., and completely etched after 320° C. The 2-layer $MoS_2$ on the silicon dioxide substrate is also almost not etched below 270° C., gradually etched above 270° C., and completely etched above 320° C. However, the etching rate of the 2-layer $MoS_2$ is greater than the etching rate of the 1-layer $MoS_2$ at the temperature of 270° C.~300° C. FIG. 2 shows optical photos of the pristine $MoS_2$ sample on the silicon dioxide substrate before annealing and the annealed $MoS_2$ sample on the silicon dioxide substrate after annealing at 290° C. FIG. 3 shows an atomic force microscope topography of the area 1 of FIG. 2. FIG. 4 shows an atomic force microscope topography of the area 2 of FIG. 2. In FIGS. 3-4, the left photo is an enlargement of portion of the right photo that is in the rectangle. From FIGS. 2-4, it is found that the 2-layer $MoS_2$, 3-layer $MoS_2$, and 4-layer $MoS_2$ may be etched to a 1-layer $MoS_2$ after annealing at 290° C. FIG. 4 shows that, after annealing at 290° C., the 1-layer $MoS_2$ on the silicon dioxide substrate is almost not etched, but the 2-layer $MoS_2$ on the silicon dioxide substrate is etched to form some triangle through holes. Thus, the 1-layer $MoS_2$ on the silicon dioxide substrate is more thermally stable than the multi-layer $MoS_2$ on the silicon dioxide substrate at the temperature of 270° C.~300° C.

Figure 5:
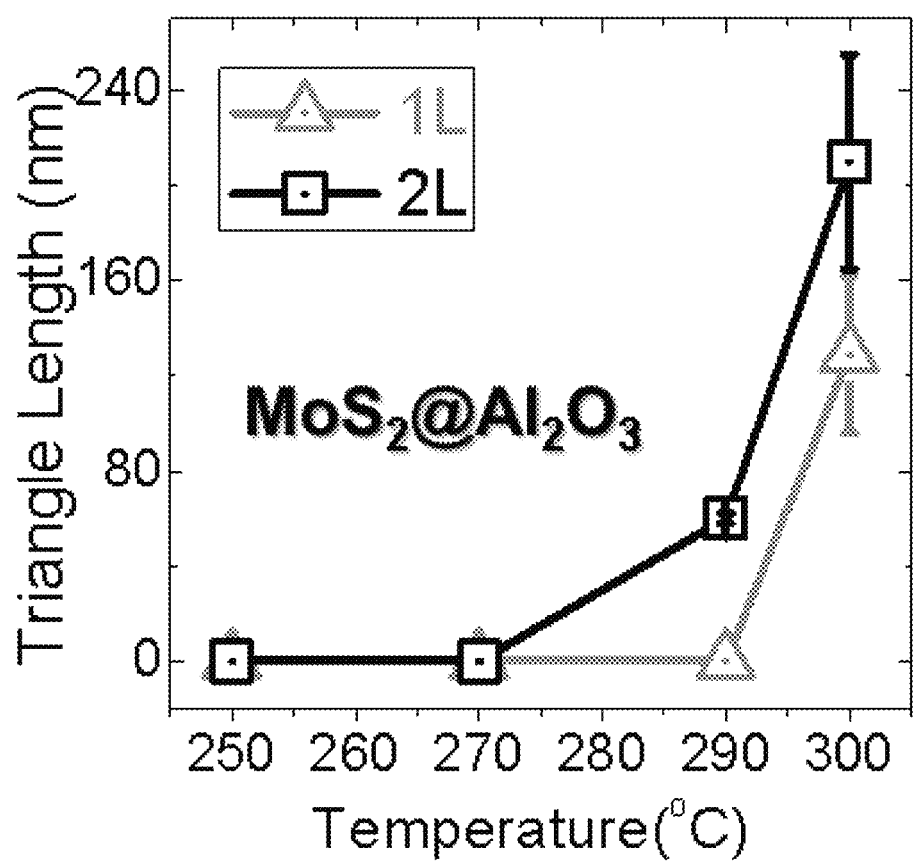
FIG. 5 shows the relationship between the triangle length and the annealing temperature of the 1-layer $MoS_2$ and the 2-layer $MoS_2$ on the sapphire substrate.
Figure 6:
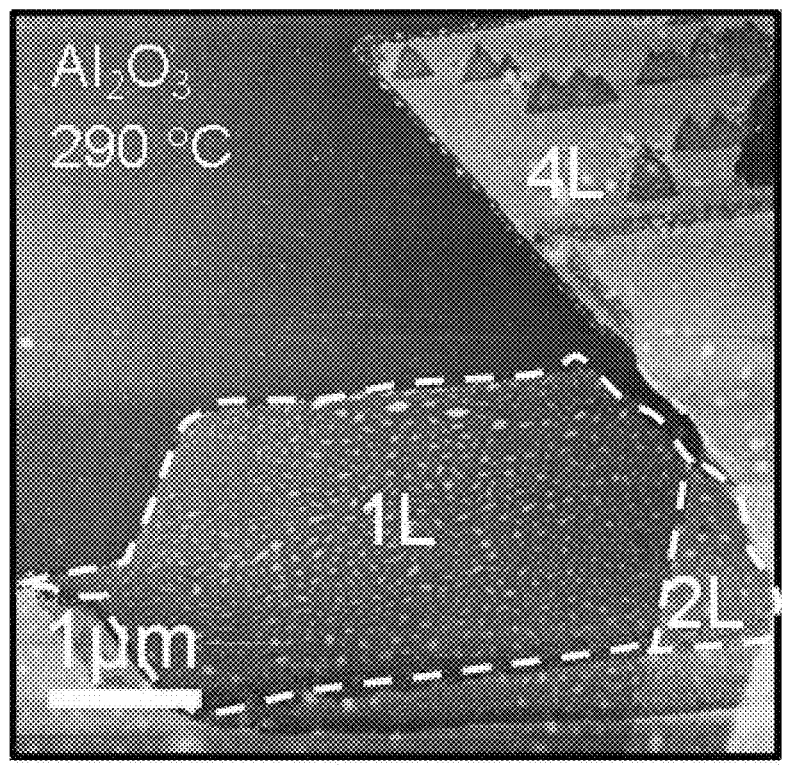
FIG. 6 shows an atomic force microscope topography of the annealed $MoS_2$ sample on the sapphire substrate after annealing at 290° C.

FIG. 5 shows the relationship between the triangle length and the annealing temperature of the 1-layer $MoS_2$ and the 2-layer $MoS_2$ on the sapphire substrate. It is found that, at atmospheric pressure, the 1-layer $MoS_2$ on the sapphire substrate is almost not etched before 290° C., gradually etched after 290° C., and completely etched after 300° C. The 2-layer $MoS_2$ on the sapphire substrate is also almost not etched before 270° C., gradually etched after 270° C., and completely etched after 350° C. FIG. 6 shows an atomic force microscope topography of the annealed $MoS_2$ sample on the sapphire substrate after annealing at 290° C. From FIG. 6, it is found that both the 2-layer $MoS_2$ and the 4-layer $MoS_2$ are etched, but only the 1-layer $MoS_2$ is almost not etched. The 1-layer $MoS_2$ on the sapphire substrate is more thermally stable than the multi-layer $MoS_2$ on the sapphire substrate at the temperature of 270° C.~300° C. Thus, the $MoS_2$ sample on the sapphire substrate and the $MoS_2$ sample on the silicon dioxide substrate have similar thermal stability at the temperature of 290° C.~300° C.

Figure 7:
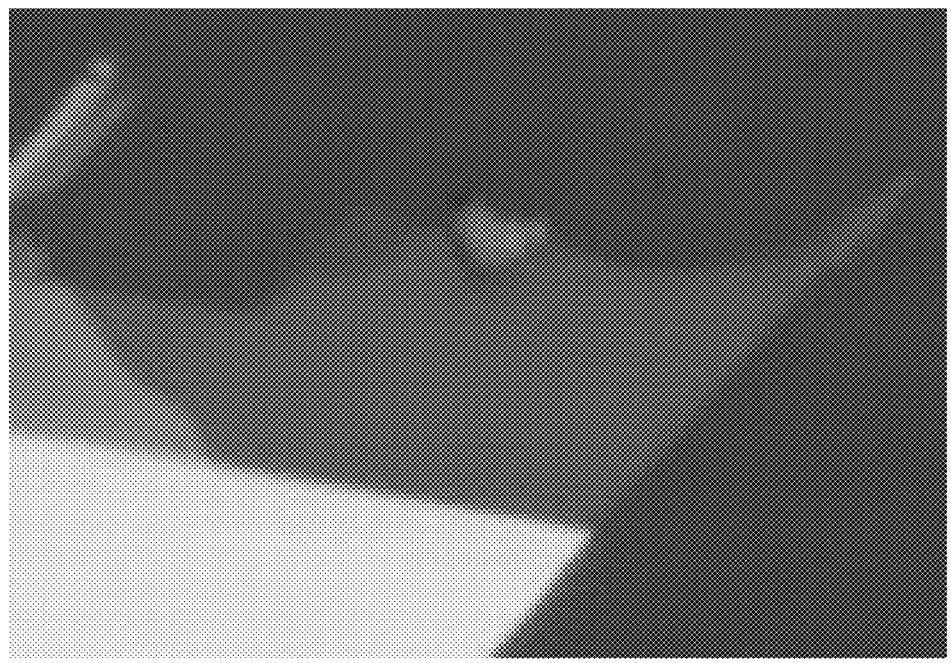
FIG. 7 shows an optical photo of the pristine 1-layer $MoS_2$ on the quartz substrate before annealing.
Figure 8:
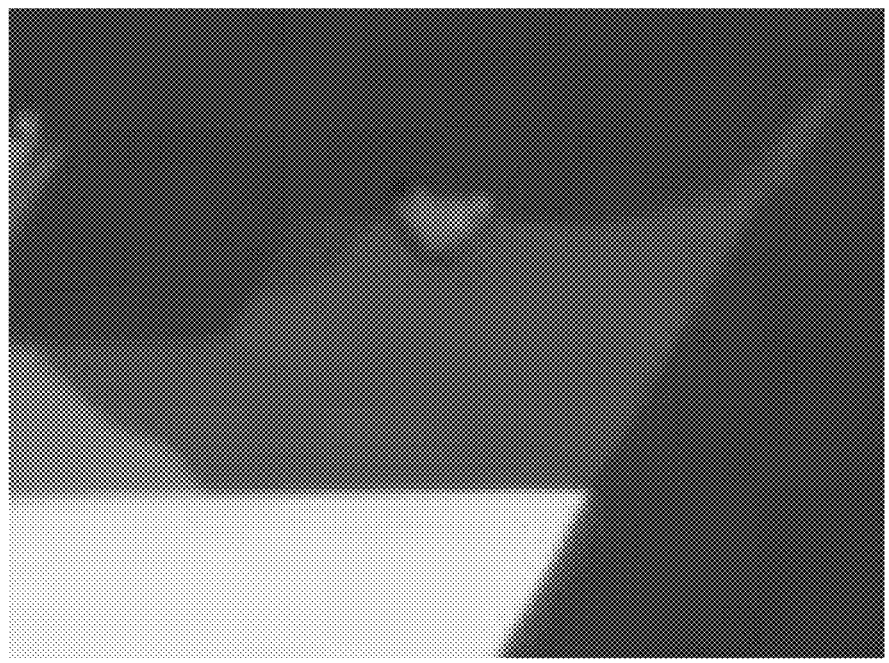
FIG. 8 shows an optical photo of the annealed 1-layer $MoS_2$ on the quartz substrate after annealing at 290° C.

FIG. 7 shows an optical photo of the pristine 1-layer $MoS_2$ on the quartz substrate before annealing. FIG. 8 shows an optical photo of the annealed 1-layer $MoS_2$ on the quartz substrate after annealing at 290° C. The 1-layer $MoS_2$ on the quartz substrate has almost no change before and after annealing at 290° C., but the multi-layer $MoS_2$ on the quartz substrate are etched to form many channels. Thus, the $MoS_2$ sample on the quartz substrate and the $MoS_2$ sample on the silicon dioxide substrate have similar thermal stability at the temperature of 290° C.~300° C. On any one of the quartz substrate, the silicon dioxide substrate, and the sapphire substrate, the 1-layer $MoS_2$ is more thermally stable than the multi-layer $MoS_2$.

Figure 9:
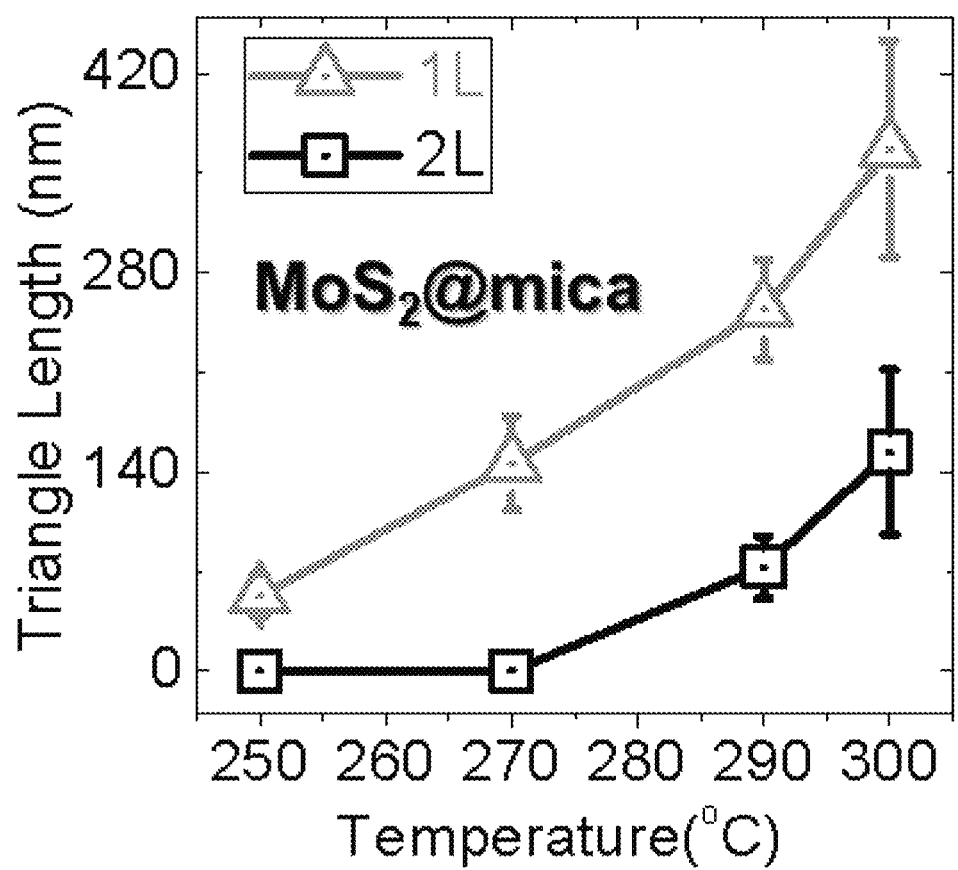
FIG. 9 shows the relationship between the triangle length and the annealing temperature of the 1-layer $MoS_2$ and the 2-layer $MoS_2$ on the mica substrate.
Figure 10:
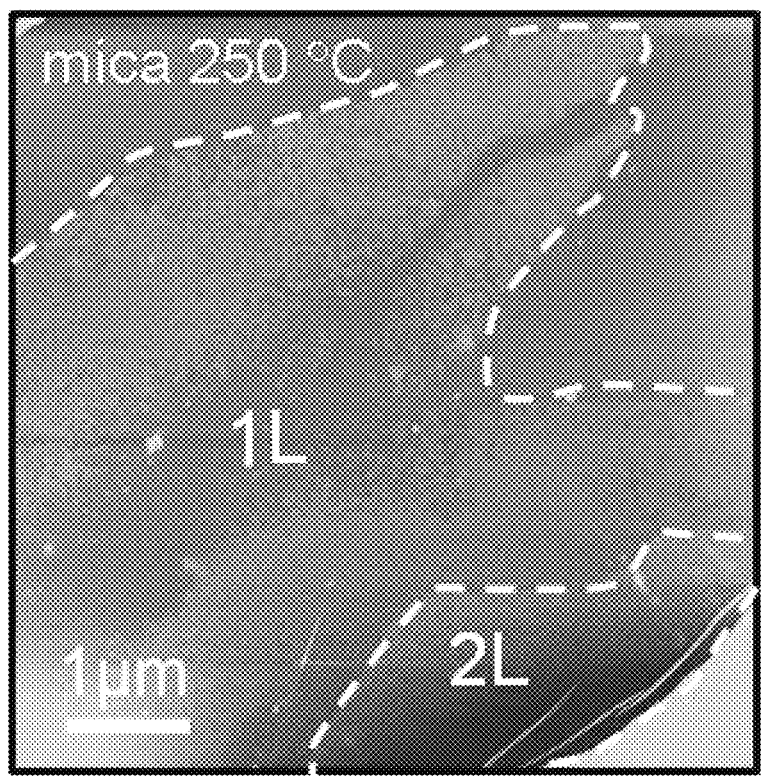
FIG. 10 shows an atomic force microscope topography of the annealed $MoS_2$ sample on the mica substrate after annealing at 250° C.

FIG. 9 shows the relationship between the triangle length and the annealing temperature of the 1-layer $MoS_2$ and the 2-layer $MoS_2$ on the mica substrate. It is found that, at atmospheric pressure, the 1-layer $MoS_2$ on the mica substrate can be completely etched after 250° C. The 2-layer $MoS_2$ on the mica substrate is also almost not etched before 270° C., gradually etched after 270° C., and completely etched after 320° C. FIG. 10 shows an atomic force microscope topography of the annealed $MoS_2$ sample on the mica substrate after annealing at 250° C. From FIG. 10, it is found that half portion of the 1-layer $MoS_2$ is completely etched after annealing at 250° C., and the other half portion of the 1-layer $MoS_2$ is etched to form a plurality of dense through holes and can be completely etched by extending etching time. However, the multi-layer $MoS_2$ is almost not etched. Thus, the multi-layer $MoS_2$ on the mica substrate is more thermally stable than the 1-layer $MoS_2$ on the mica substrate.

From FIGS. 1, 5, and 9, it is found that the mica substrate, the silicon dioxide substrate and the sapphire substrate have less effect on the thermal stabilities of the 2-layer $MoS_2$ thereon, but have notable effect on the thermal stabilities of the 1-layer $MoS_2$ thereon. The silicon dioxide substrate or the sapphire substrate increases the thermal stabilities of the 1-layer $MoS_2$ thereon, but the mica substrate decreases the thermal stabilities of the 1-layer $MoS_2$ thereon.

Figure 11:
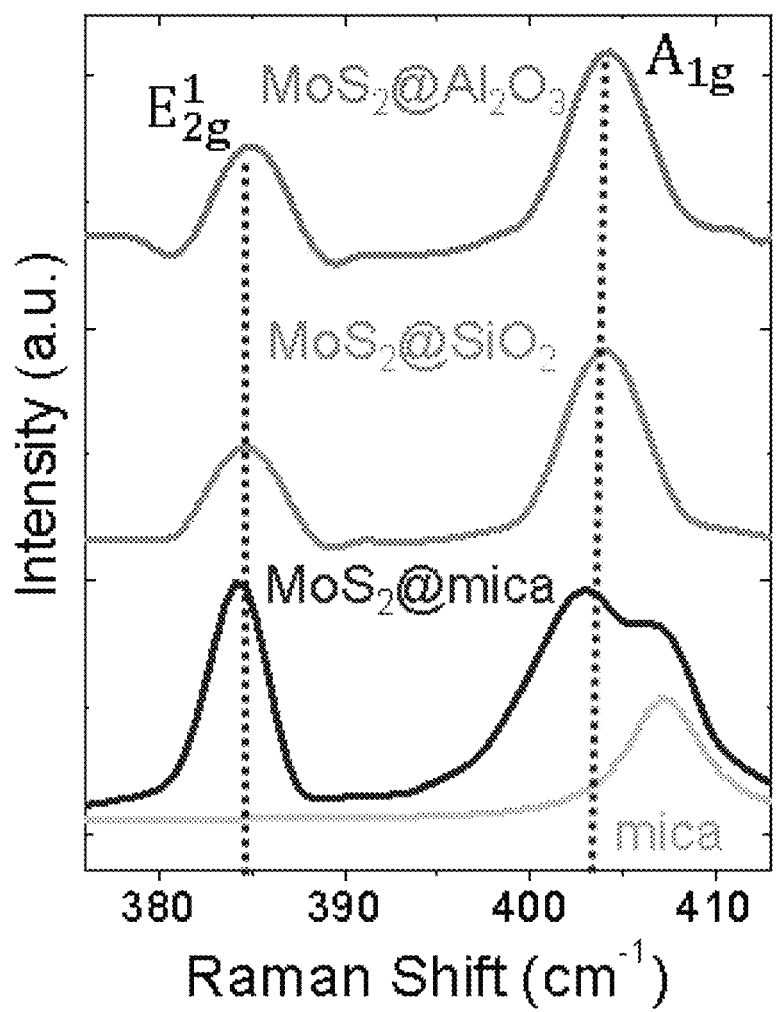
FIG. 11 shows a Raman spectrum of the $MoS_2$ samples respectively on the sapphire substrate, the silicon dioxide substrate, the mica substrate before annealing, and a Raman spectrum of the mica substrate.
Figure 12:
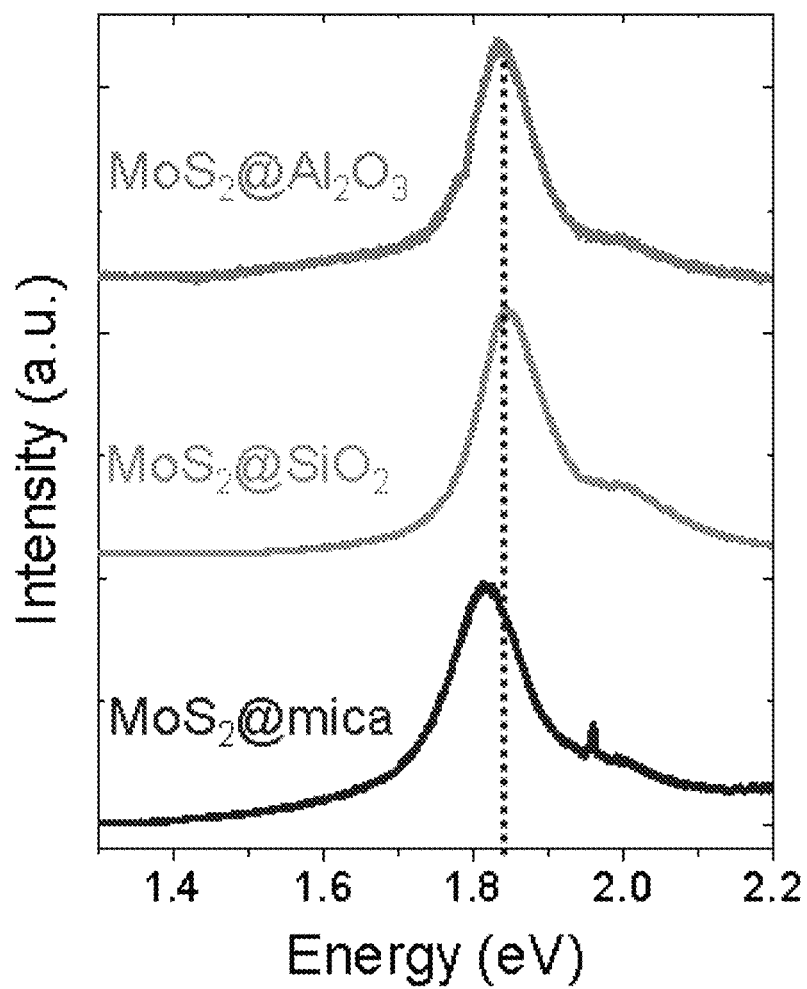
FIG. 12 shows a Photoluminescence spectrum of the $MoS_2$ samples respectively on the sapphire substrate, the silicon dioxide substrate, and the mica substrate before annealing.
Figure 13:
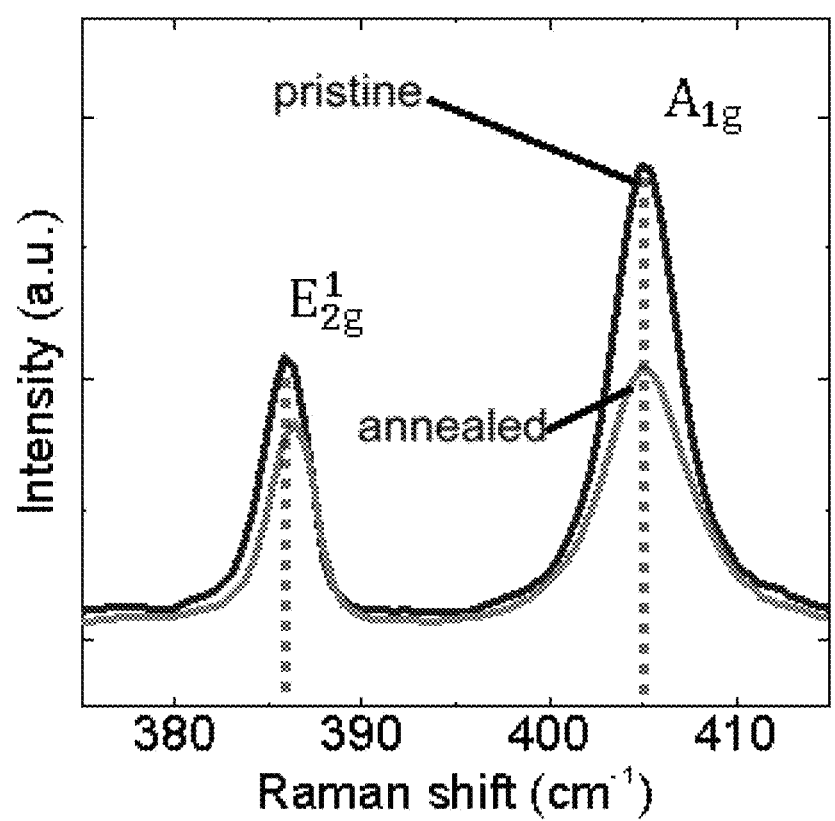
FIG. 13 shows a Raman spectrum of the pristine $MoS_2$ on the silicon dioxide substrate before annealing and the annealed $MoS_2$ on the silicon dioxide substrate after annealing at 290° C.
Figure 14:
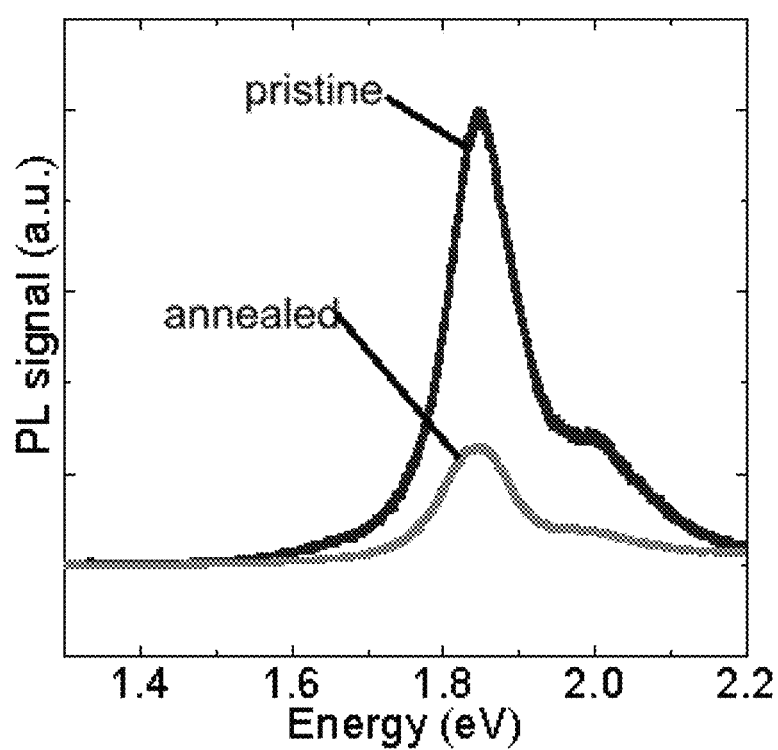
FIG. 14 shows a Photoluminescence spectrum of the pristine $MoS_2$ on the silicon dioxide substrate before annealing and the annealed $MoS_2$ on the silicon dioxide substrate after annealing at 290° C.

The MoS$_2$ samples on different substrates are tested by Raman spectrum and Photoluminescence spectrum. FIG. 11 shows a Raman spectrum of the MoS$_2$ samples respectively on the sapphire substrate, the silicon dioxide substrate, and the mica substrate before annealing, and a Raman spectrum of the mica substrate. FIG. 12 shows a Photoluminescence spectrum of the MoS$_2$ samples respectively on the sapphire substrate, the silicon dioxide substrate, and the mica substrate before annealing. FIG. 13 shows a Raman spectrum of the pristine MoS$_2$ on the silicon dioxide substrate before annealing and the annealed MoS$_2$ on the silicon dioxide substrate after annealing at 290° C. FIG. 14 shows a Photoluminescence spectrum of the pristine MoS$_2$ on the silicon dioxide substrate before annealing and the annealed MoS$_2$ on the silicon dioxide substrate after annealing at 290° C. From FIGS. 11-14, it is found that the crystallinity of the MoS$_2$ is almost not changed after annealing, but some defects are introduced in the MoS$_2$ during annealing.

Furthermore, the relationship between the annealing pressure and the layer number of the MoS$_2$ are tested. The 1-layer MoS$_2$, 2-layer MoS$_2$, 3-layer MoS$_2$ are annealed in a tube furnace filled with air of 10 KPa and 30 millitorr at a temperature of 240° C.~350° C. with a temperature rise rate of 20° C./minute.

Figure 15:
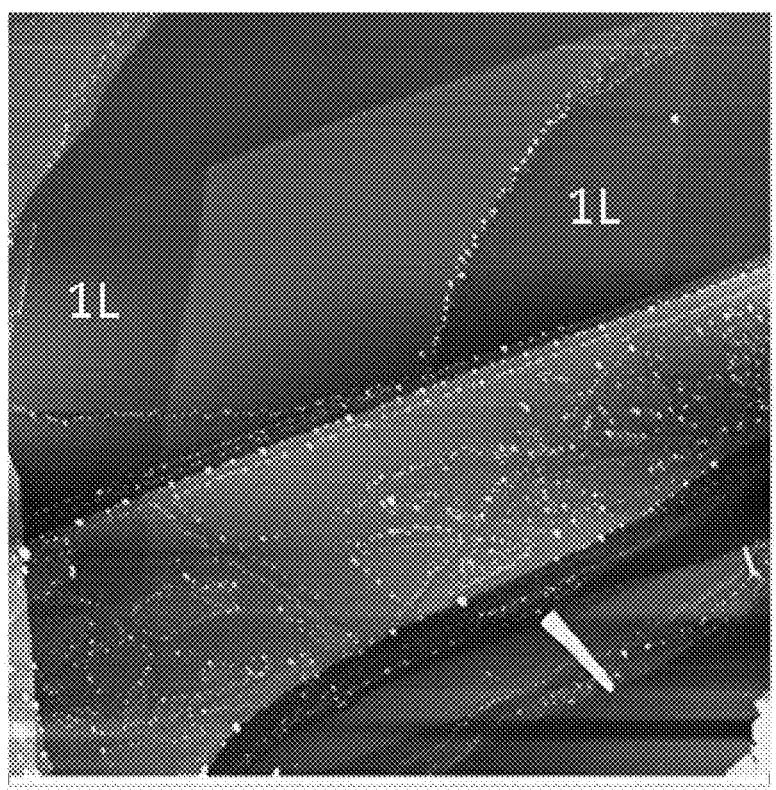
FIG. 15 shows an atomic force microscope topography of the 1-layer $MoS_2$, 2-layer $MoS_2$, 3-layer $MoS_2$ on the silicon dioxide substrate after annealed at 300° C. in air of 10 KPa.

FIG. 15 shows an atomic force microscope topography of the 1-layer MoS$_2$, 2-layer MoS$_2$, 3-layer MoS$_2$ on the silicon dioxide substrate after annealed at 300° C. in air of 10 KPa. After annealed at 300° C. in air of 10 KPa, the 1-layer MoS$_2$ on the silicon dioxide substrate is almost not etched, but the 2-layer MoS$_2$, 3-layer MoS$_2$ on the silicon dioxide substrate are notably etched to form many MoO$_3$ grains. As the decrease of the annealing pressure, the thermal stability of the MoS$_2$ on the silicon dioxide substrate increases. In air of 10 KPa, the temperature, that the 1-layer MoS$_2$ on the silicon dioxide substrate start to be etched, is 300° C.

Figure 16:
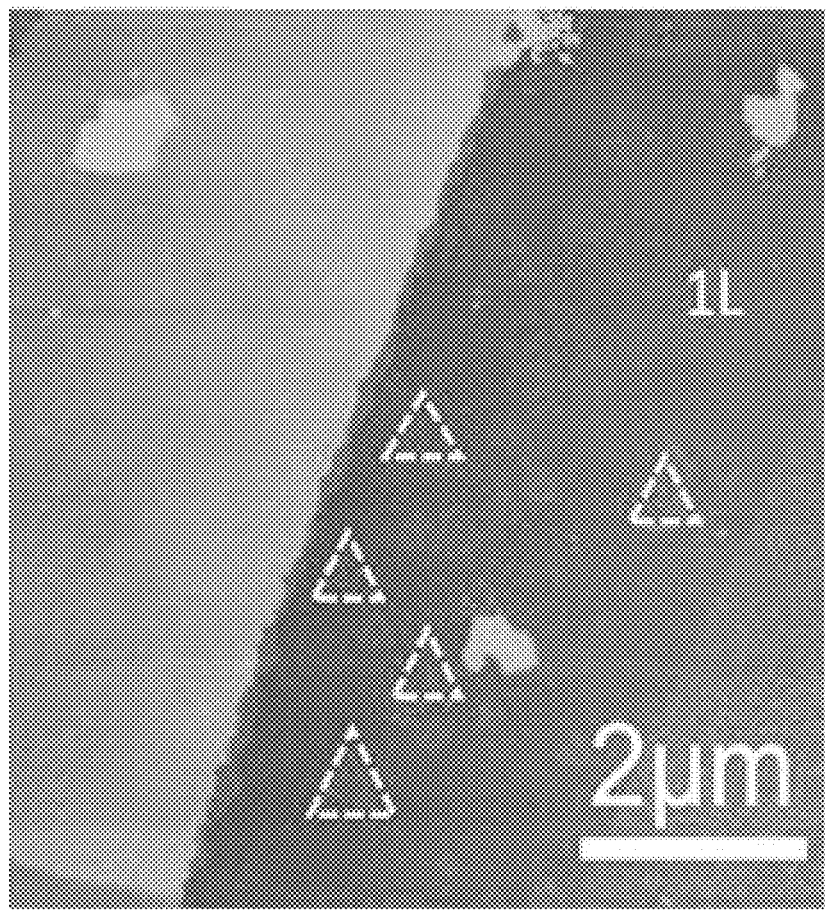
FIG. 16 shows an atomic force microscope topography of the 1-layer $MoS_2$, 2-layer $MoS_2$, 3-layer $MoS_2$ on the mica substrate after annealed at 270° C. in air of 10 KPa.

FIG. 16 shows an atomic force microscope topography of the 1-layer MoS$_2$, 2-layer MoS$_2$, 3-layer MoS$_2$ on the mica substrate after annealed at 270° C. in air of 10 KPa. After annealed at 270° C. in air of 10 KPa, the 1-layer MoS$_2$ on the mica substrate is notably etched, but the 2-layer MoS$_2$ and 3-layer MoS$_2$ on the mica substrate are almost not etched. As the decrease of the annealing pressure, the thermal stability of the MoS$_2$ on the mica substrate increases. In air of 10 KPa, the temperature, that the 1-layer MoS$_2$ on the mica substrate starts to be etched, is 270° C.

Figure 17:
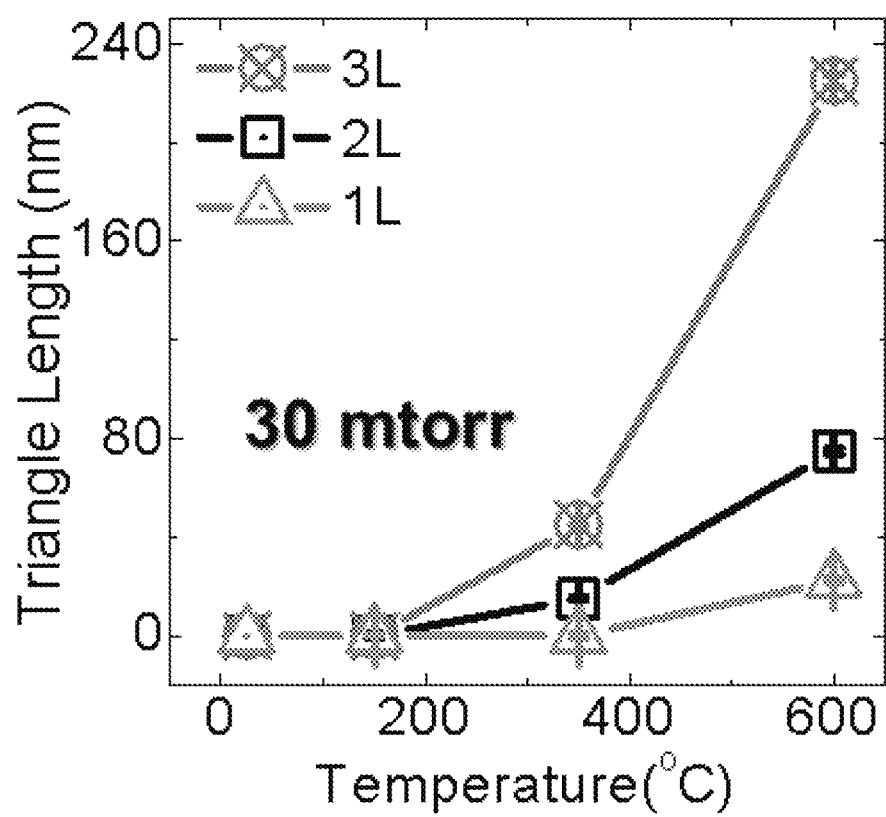
FIG. 17 shows a thermal stability of the $MoS_2$ on the silicon dioxide substrate after annealing in air of 30 millitorr.

FIG. 17 shows a thermal stability of the MoS$_2$ on the silicon dioxide substrate after annealing in air of 30 millitorr. The 1-layer MoS$_2$ on the silicon dioxide substrate is almost not etched before 350° C., and gradually etched after 350° C. Only a little part of the 1-layer MoS$_2$ on the silicon dioxide substrate is etched at 600° C. As the increase of the layer number of the MoS$_2$, the thermal stability of the MoS$_2$ on the silicon dioxide substrate notably decreases. The 3-layer MoS$_2$ on the silicon dioxide substrate is gradually slowly etched after 200° C., and fast etched after 350° C. The thermal stability of the 1-layer MoS$_2$ in low pressure is better than the thermal stability of the 1-layer MoS$_2$ in atmospheric pressure.

Figure 18:
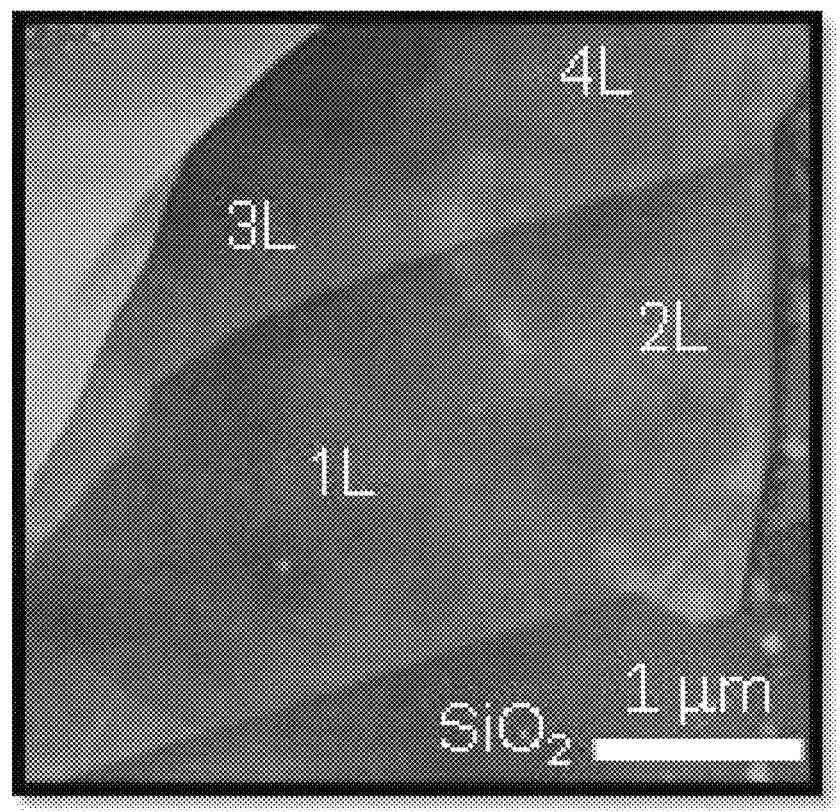
FIG. 18 shows an atomic force microscope topography of the pristine $MoS_2$ on the silicon dioxide substrate before annealing.
Figure 19:
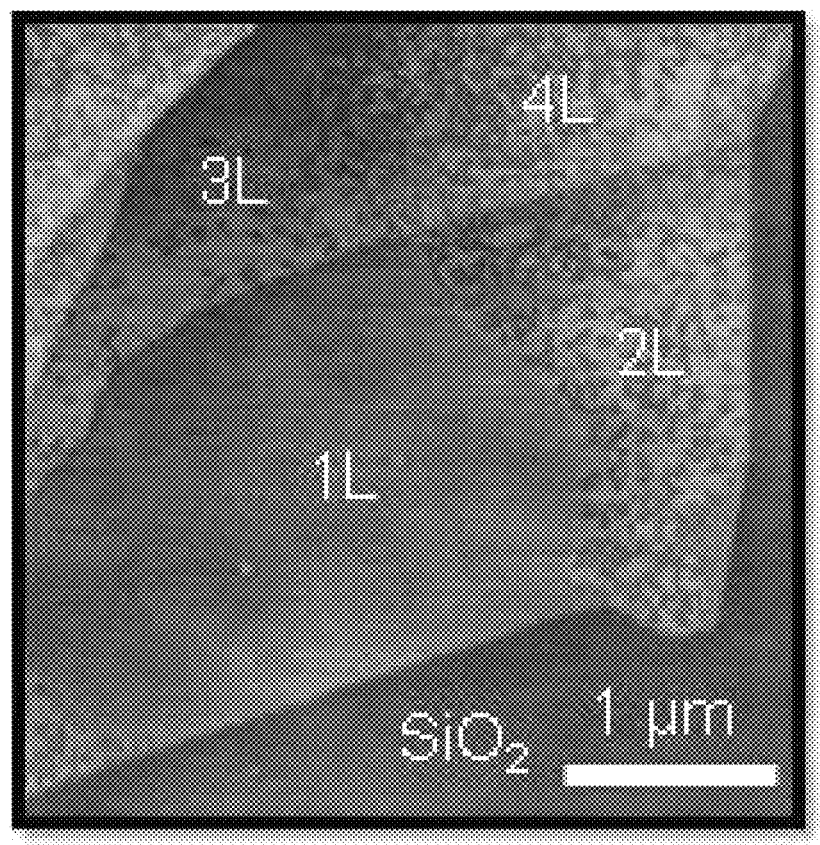
FIG. 19 shows an atomic force microscope topography of the annealed $MoS_2$ on the silicon dioxide substrate after annealing at 350° C. in air of 30 millitorr.

FIG. 18 shows an atomic force microscope topography of the pristine MoS$_2$ on the silicon dioxide substrate before annealing. FIG. 19 shows an atomic force microscope topography of the annealed MoS$_2$ on the silicon dioxide substrate after annealing at 350° C. in air of 30 millitorr. From FIGS. 18-19, it is found that the 1-layer MoS$_2$ on the silicon dioxide substrate is almost not etched, but the 2-layer MoS$_2$ and 3-layer MoS$_2$ on the silicon dioxide substrate are notably etched. Because the atomic polarization, the binding force between the 1-layer MoS$_2$ and the silicon dioxide substrate is stronger than the binding force between the adjacent MoS$_2$ of multi-layer MoS$_2$. The distance between the 1-layer MoS$_2$ and the silicon dioxide substrate is less than the distance between the adjacent MoS$_2$ of multi-layer MoS$_2$. Thus, the oxygen gas, that can enter the space between the adjacent MoS$_2$ of multi-layer MoS$_2$, is more than the oxygen gas, that can enter the space between the 1-layer MoS$_2$ and the silicon dioxide substrate. Thus, the thermal stability of the 1-layer MoS$_2$ on the silicon dioxide substrate is better than the thermal stability of the multi-layer MoS$_2$ on the silicon dioxide substrate.

Furthermore, the TMDs, such as tungsten disulfide (WS$_2$), molybdenum selenide (MoSe$_2$), tungsten diselenide (WSe$_2$), molybdenum telluride (MoTe$_2$) or tungsten telluride (WTe$_2$), also show the similar etching behaviors as discussed above like MoS$_2$. This illustrates that to these MoS$_2$ analogues, substrate can also modify their thermal stability.

A method for making 1-layer patterned 2D TMDs nanomaterials is provided. The method can remove the specific portion of the 1-layer 2D TMDs nanomaterials by selecting and patterning the substrate and controlling the annealing temperature or annealing pressure. The methods of different embodiment are described as below.

Embodiment 1

Figure 20:
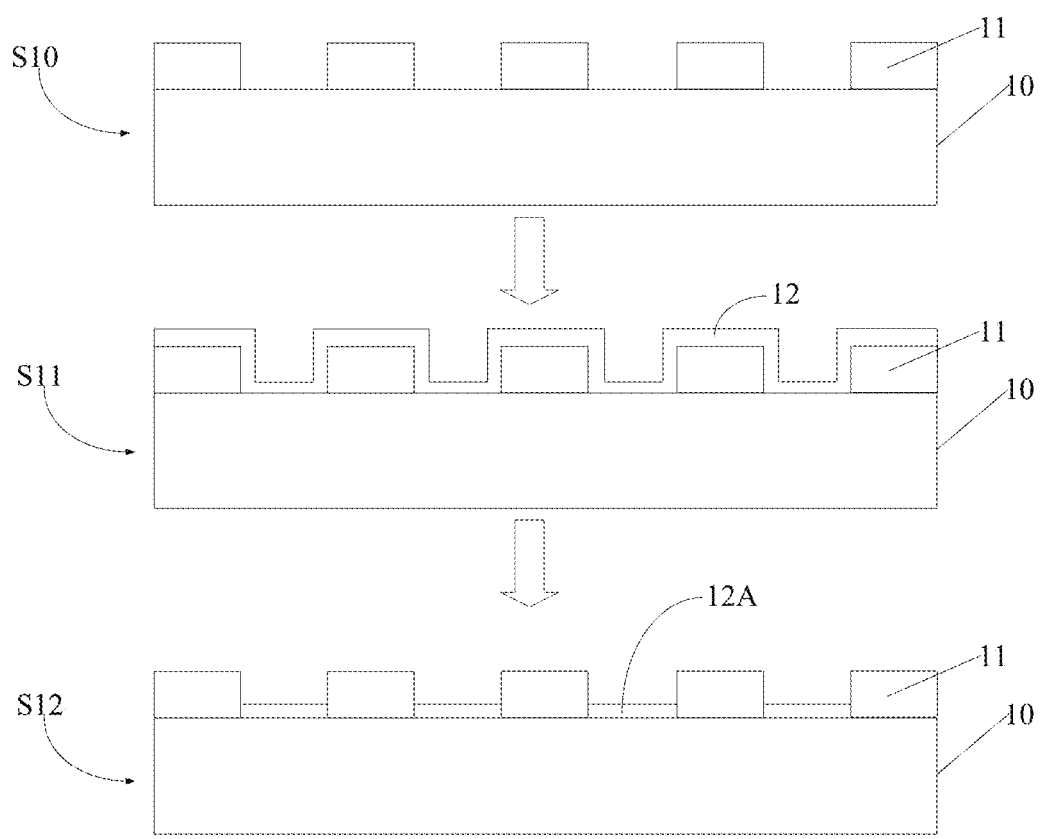
FIG. 20 is a flow diagram of embodiment 1 of a method for making patterned 2D TMDs nanomaterials.

FIG. 20 shows a method for making patterned 2D TMDs nanomaterials of embodiment 1, and the method includes one or more of the following actions:

S10, applying a patterned mica layer 11 on a surface of the sapphire substrate 10, the patterned mica layer 11 defines a plurality of through holes so that part of the surface of the sapphire substrate 10 is exposed to form an exposed surface;

S11, placing a 1-layer MoS$_2$ 12 on the sapphire substrate 10 to cover the patterned mica layer 11 to form a preform, the 1-layer MoS$_2$ 12 includes a first portion located on and in direct contact with the patterned mica layer 11 and a second portion located on and in direct contact with the exposed surface of the sapphire substrate 10;

S12, annealing the preform in a tube furnace filled with air at atmospheric pressure, the annealing temperature ranges from 250° C. to about 290° C., so that the first portion of the 1-layer MoS$_2$ 12 is removed by oxidation, and the second portion of the 1-layer MoS$_2$ 12 is remained on the sapphire substrate 10 to form the patterned MoS$_2$ 12A.

In action S10, the method for making the patterned mica layer 11 is not limited and can be screen printing, printer printing, nesting, or photolithography. In one embodiment, the five spaced apart mica strips are formed on the sapphire substrate 10 by photolithography. Each mica strip has a thickness ranging from about 5 nanometers to about 500 nanometers. If the thickness of the mica strip is too large, the 1-layer MoS$_2$ 12 is easily suspended between adjacent mica strips and broken owing to the relatively large height difference compared to the thickness of monolayer 2D nanomaterials. If the thickness of the mica strip is too small, it is hard to control the thickness of the mica strip through the existing methods. The sapphire substrate 10 can be replaced by a metal oxide substrate, an inorganic nonmetal oxide substrate, a metal nitride substrate, or an inorganic nonmetal nitride substrate. The metal oxide is alumina, titanium dioxide, or magnesium oxide. The inorganic nonmetal oxide silicon dioxide or boron oxide. The metal nitride titanium nitride, aluminum nitride, gallium nitride, or magnesium nitride. The inorganic nonmetal nitride is silicon nitride or boron nitride.

In action S11, the method for placing the 1-layer $MoS_2$ 12 on the sapphire substrate 10 can be directly growing by chemical vapor deposition and other growth methods, mechanical exfoliating, or transferring. In one embodiment, the 1-layer $MoS_2$ 12 is obtained by tape stripping method first, and then transferred onto the sapphire substrate 10. The thickness of the 1-layer $MoS_2$ 12 is in nano scale. The first portion of the 1-layer $MoS_2$ 12 is in direct contact with the top surface of the patterned mica layer 11, and the second portion of the 1-layer $MoS_2$ 12 is in direct contact with the exposed surface of the sapphire substrate 10.

In action S12, the annealing is performed in a tube furnace. The tube furnace is exhausted to remove the water vapor first, and then dry air is introduced into the tube furnace so that the pressure in the tube furnace is at atmospheric pressure. The tube furnace is heated to the annealing temperature with a temperature rise rate ranging from about 10° C./minute to about 30° C./minute, and kept at the annealing temperature for an annealing time ranging from about 10 minutes to about 60 minutes. Finally, the tube furnace is cooled by nature. In one embodiment, the temperature rise rate is 20° C./minute, the annealing temperature is 270° C., and the annealing time is 15 minutes.

The annealing temperature is related to the pressure in the tube furnace and the oxygen content of the gas filled in the tube furnace. When the tube furnace is filled with air, the lower the pressure in the tube furnace is, the higher the annealing temperature should be. When the pressure in the tube furnace is constant, the lower the oxygen content of the gas filled in the tube furnace is, the higher the annealing temperature should be. As discussed above, the annealing temperature is also related to the material of the substrate 10.

The patterned $MoS_2$ 12A is directly exposed to the air and can be used to make other elements, such as electrode.

Furthermore, the patterned mica layer 11 can be removed after action S12. The patterned mica layer 11 can be removed by ultrasonic or tape sticking.

Furthermore, the patterned $MoS_2$ 12A can be transferred to a surface of other substrate after action S12. The patterned $MoS_2$ 12A can be transferred via poly(methyl methacrylate) (PMMA).

Embodiment 2

Figure 21:
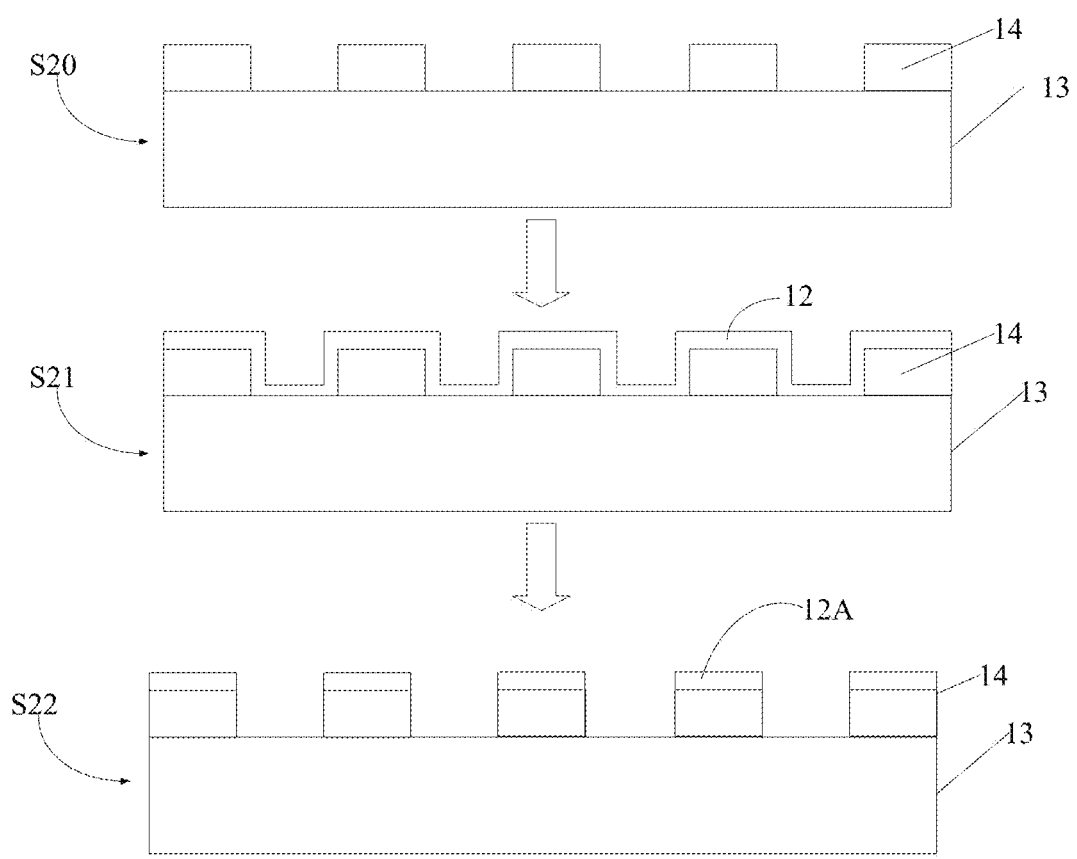
FIG. 21 is a flow diagram of embodiment 2 of a method for making patterned 2D TMDs nanomaterials.

FIG. 21 shows a method for making patterned 2D TMDs nanomaterials of embodiment 2, and the method includes one or more of the following actions:

S20, applying a patterned silicon dioxide layer 14 on a surface of the mica substrate 13, the patterned silicon dioxide layer 14 defines a plurality of through holes so that part of the surface of the mica substrate 13 is exposed to form an exposed surface;

S21, placing a 1-layer $MoS_2$ 12 on the mica substrate 13 to cover the patterned silicon dioxide layer 14 to form a preform, the 1-layer $MoS_2$ 12 includes a first portion located on and in direct contact with the patterned silicon dioxide layer 14 and a second portion located on and in direct contact with the exposed surface of the mica substrate 13;

S22, annealing the preform in a tube furnace filled with air at atmospheric pressure, the annealing temperature ranges from 250° C. to about 270° C., so that the second portion of the 1-layer $MoS_2$ 12 is removed by oxidation, and the first portion of the 1-layer $MoS_2$ 12 is remained on the patterned silicon dioxide layer 14 to form the patterned $MoS_2$ 12A.

The method of embodiment 2 is similar with the method of embodiment 1, except that, in embodiment 2, the substrate 13 is a mica plate, and the patterned layer 14 is silicon dioxide layer.

In action S20, the patterned silicon dioxide layer 14 can be made by magnetron sputtering a continuous silicon dioxide layer and then patterning the continuous silicon dioxide layer by photolithography. The patterned silicon dioxide layer 14 can also be made by directly depositing the patterned silicon dioxide layer 14 by a mask. In one embodiment, the plurality of parallel and spaced apart carbon nanotube wires are located on the mica substrate 13, a silicon dioxide layer is deposited on the mica substrate 13 by magnetron sputtering to cover the plurality of carbon nanotube wires, and the plurality of carbon nanotube wires are removed to form the patterned silicon dioxide layer 14.

In action S21, the method for placing the 1-layer $MoS_2$ 12 is the same as the method of S11. In action S22, the method for annealing is similar with the method of S12, except that the annealing temperatures and the annealing times are different.

Embodiment 3

Figure 22:
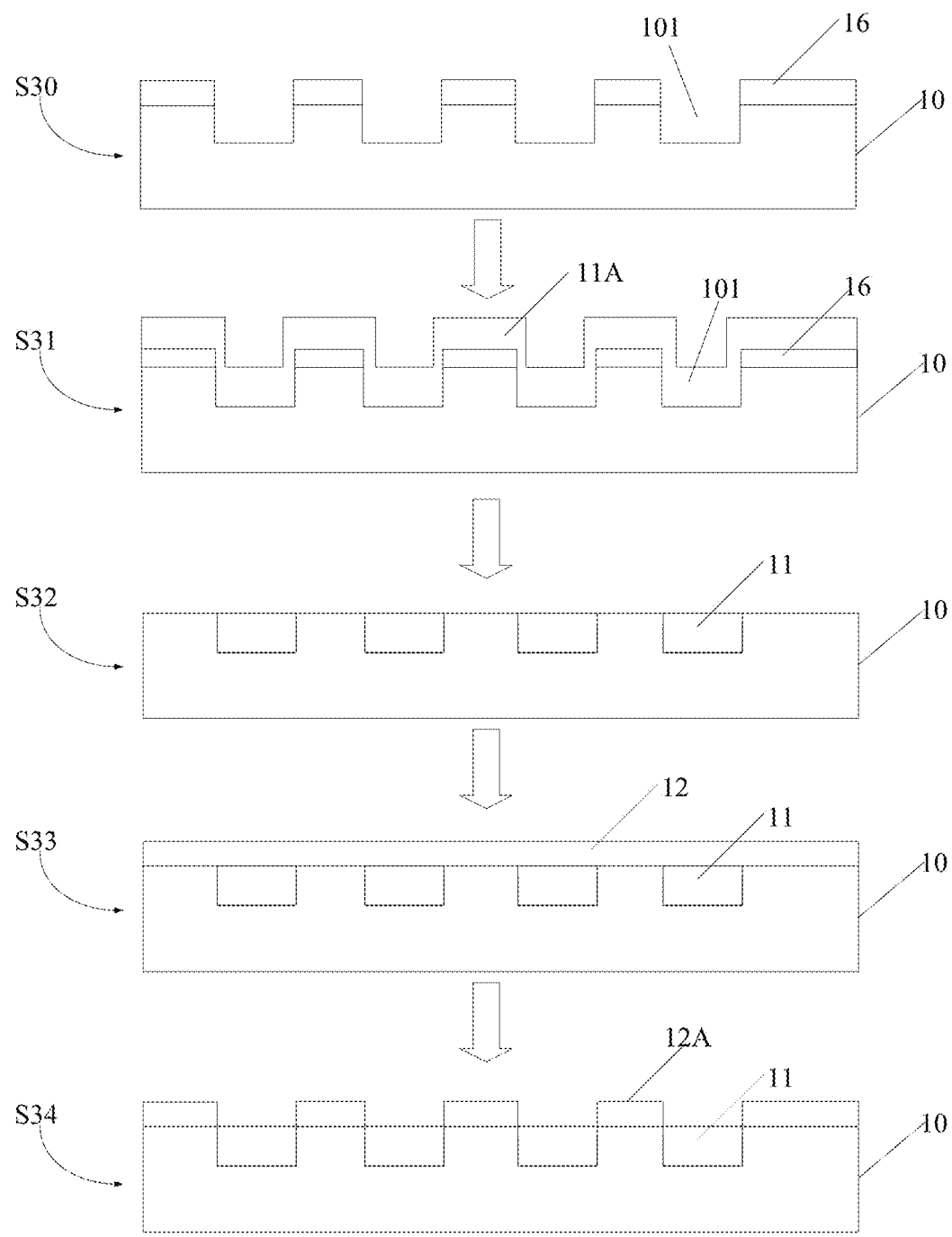
FIG. 22 is a flow diagram of embodiment 3 of a method for making patterned 2D TMDs nanomaterials.

FIG. 22 shows a method for making patterned 2D TMDs nanomaterials of embodiment 3, and the method includes one or more of the following actions:

S30, applying a mask 16 on a surface of the sapphire substrate 10, and etching the sapphire substrate 10 via the mask 16 to form a plurality of grooves 101;

S31, applying a continuous mica layer 11A on the sapphire substrate 10 to cover both the sapphire substrate 10 and the mask 16;

S32, removing the mask 16 and portion of the continuous mica layer 11A, that is on the mask 16, to form a patterned mica layer 11, so that part of the surface of the sapphire substrate 10 is exposed to form an exposed surface;

S33, placing a 1-layer $MoS_2$ 12 on the sapphire substrate 10 to cover the patterned mica layer 11 to form a preform, the 1-layer $MoS_2$ 12 includes a first portion located on and in direct contact with the patterned mica layer 11 and a second portion located on and in direct contact with the exposed surface of the sapphire substrate 10;

S34, annealing the preform in a tube furnace filled with air at atmospheric pressure, the annealing temperature ranges from 250° C. to about 290° C., so that the first portion of the 1-layer $MoS_2$ 12 is removed by oxidation, and the second portion of the 1-layer $MoS_2$ 12 is remained on the sapphire substrate 10 to form the patterned $MoS_2$ 12A.

The method of embodiment 3 is similar with the method of embodiment 1, except that, in embodiment 3, the sapphire substrate 10 is etched to form the plurality of grooves 101, and the patterned mica layer 11 is formed in the plurality of grooves 101.

The thickness of the patterned mica layer 11 is the same as the depth of the groove 101. The top surface of the patterned mica layer 11 flushes the top surface of the sapphire substrate 10. Thus, a larger contact area can be formed between the 1-layer $MoS_2$ 12 and the top surface of both the patterned mica layer 11 and the sapphire substrate 10.

In action S30, the mask 16 can be made by transferring or photolithography. In one embodiment, the mask 16 is a free-standing carbon nanotube film. The carbon nanotube film includes a plurality of carbon nanotubes and a protective layer coated on each of the plurality of carbon nanotubes. The protective layer includes material such as metal oxides, inorganic nonmetallic oxides, metal nitrides, or inorganic nonmetallic nitrides. The carbon nanotube film is directly placed on the sapphire substrate 10. The sapphire substrate 10 is dry etched by plasma or reactive ion etching (RIE).

In action S31, the continuous mica layer 11A can be deposited by electron beam deposition, spin coating, or transfer printing. In action S32, the carbon nanotube film mask 16 can be removed by mechanical peeling. The portion of the mica, that is on the carbon nanotube film, is removed together with the carbon nanotube film. The mask 16 can also be removed by dissolving, ultrasonic, or tape sticking.

Embodiment 4

Figure 23:
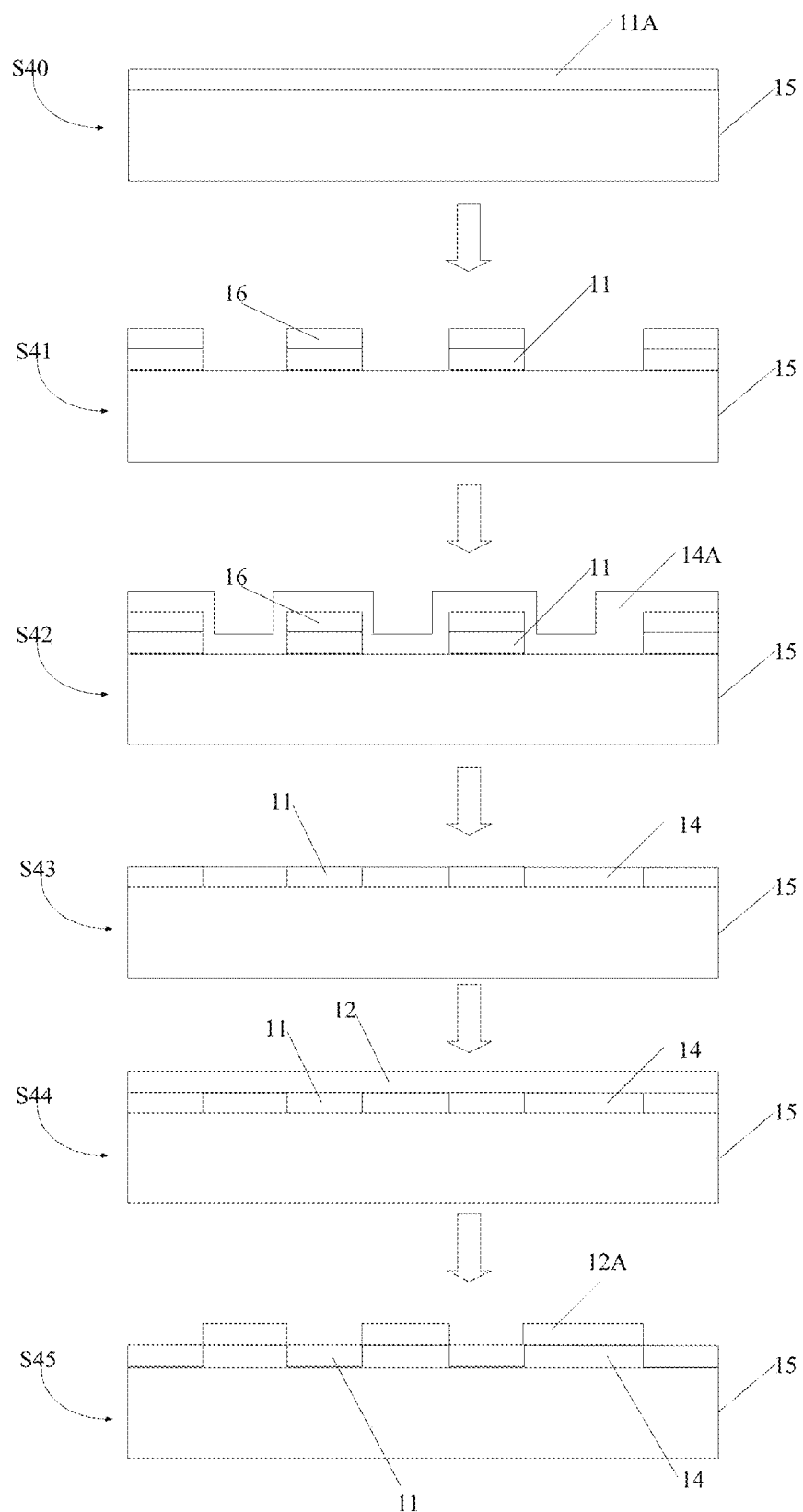
FIG. 23 is a flow diagram of embodiment 4 of a method for making patterned 2D TMDs nanomaterials.

FIG. 23 shows a method for making patterned 2D TMDs nanomaterials of embodiment 4, and the method includes one or more of the following actions:

S40, making a continuous mica layer 11A on a surface of a metal sheet 15;

S41, applying a mask 16 on a surface of the continuous mica layer 11A, and etching the continuous mica layer 11A via the mask 16 to form a patterned mica layer 11;

S42, depositing a continuous silicon dioxide layer 14A on the metal sheet 15 to cover both the metal sheet 15, the patterned mica layer 11, and the mask 16;

S43, removing the mask 16 and portion of the continuous silicon dioxide layer 14A, that is on the mask 16, to form a patterned silicon dioxide layer 14;

S44, placing a 1-layer $MoS_2$ 12 on the metal sheet 15 to cover both the patterned mica layer 11 and the patterned silicon dioxide layer 14 to form a preform, the 1-layer $MoS_2$ 12 includes a first portion located on and in direct contact with the patterned mica layer 11 and a second portion located on and in direct contact with the patterned silicon dioxide layer 14;

S45, annealing the preform in a tube furnace filled with air at atmospheric pressure, the annealing temperature ranges from 250° C. to about 270° C., so that the first portion of the 1-layer $MoS_2$ 12 is removed by oxidation, and the second portion of the 1-layer $MoS_2$ 12 is remained on the patterned silicon dioxide layer 14 to form the patterned $MoS_2$ 12A.

The method of embodiment 4 is similar with the method of embodiment 3, except that, in embodiment 4, both the patterned mica layer 11 and the patterned silicon dioxide layer 14 are formed on the metal sheet 15. The method of embodiment 4 can make the patterned $MoS_2$ 12A on any other substrate which does not increase or decrease the thermal stability of the $MoS_2$.

Embodiment 5

Figure 24:
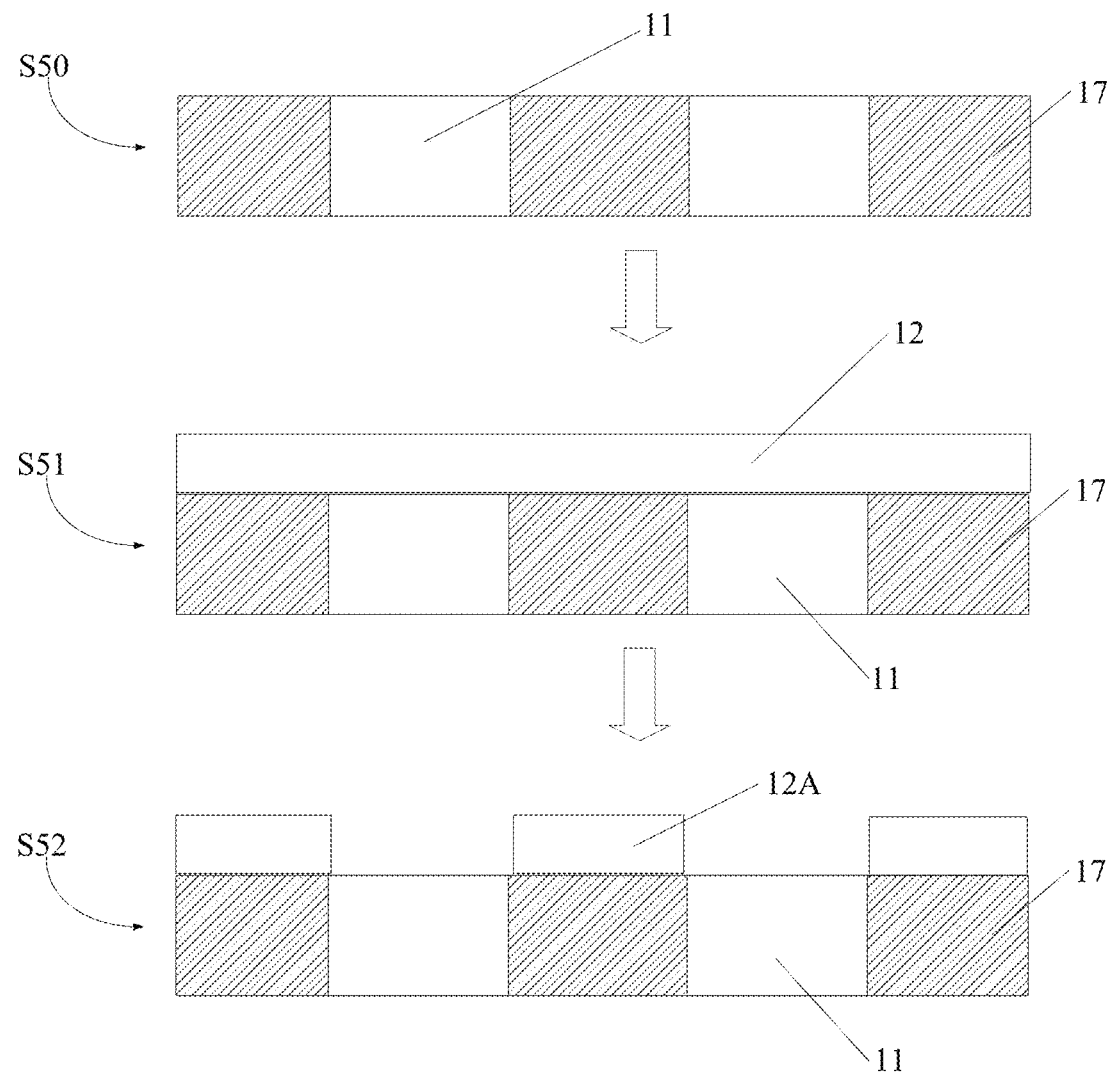
FIG. 24 is a flow diagram of embodiment 5 of a method for making patterned 2D TMDs nanomaterials.

FIG. 24 shows a method for making patterned 2D TMDs nanomaterials of embodiment 5, and the method includes one or more of the following actions:

S50, alternately arranging a plurality of silicon substrates and a plurality of mica substrates to form a patterned silicon substrate 17 and a patterned mica layer 11, each silicon substrate includes a silicon dioxide layer;

S51, placing a 1-layer $MoS_2$ 12 on the patterned silicon substrate 17 and the patterned mica layer 11 to cover both the patterned silicon substrate 17 and the patterned mica layer 11 to form a preform, the 1-layer $MoS_2$ 12 includes a first portion located on and in direct contact with the patterned mica layer 11 and a second portion located on and in direct contact with the silicon dioxide layer of the patterned silicon substrate 17;

S52, annealing the preform in a tube furnace filled with air a pressure of 10 KPa, the annealing temperature is about 290° C., so that the first portion of the 1-layer $MoS_2$ 12 is removed by oxidation, and the second portion of the 1-layer $MoS_2$ 12 is remained on the patterned silicon substrate 17 to form the patterned $MoS_2$ 12A.

The method of embodiment 5 is similar with the method of embodiment 1, except that, in embodiment 5, a plurality of silicon substrates and a plurality of mica substrates are used to form the patterned silicon substrate 17 and the patterned mica layer 11. Thus, it is easy to change the pattern of the patterned silicon substrate 17 and the patterned mica layer 11.

This method can make patterned 2D TMDs nanomaterials by annealing without any photoresist in direct contact with the 2D TMDs nanomaterials. Thus, the patterned 2D TMDs nanomaterials would not be polluted by chemical agent.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the actions of methods described may be removed, others may be added, and the sequence of actions may be altered. It is also to be understood that the description and the claims drawn to a method may include some indication in reference to certain actions. However, the indication used is only to be viewed for identification purposes and not as a suggestion as to an order for the actions.

What is claimed is:

1. A method for making patterned two dimensional (2D) transition metal dichalcogenides (TMDs) nanomaterials, the method comprising:
    making a substrate having a substrate surface, wherein the substrate surface comprises a first portion surface and a second portion surface, the first portion surface is formed by a material selected from the group consisting of oxide, nitride and combination thereof, and the second portion surface is formed by mica;
    applying a single layer 2D TMDs nanomaterials on the substrate surface to form a preform, wherein the single layer 2D TMDs nanomaterials comprises a first portion and a second portion, the first portion is located on and in direct contact with the first portion surface, and the second portion is located on and in direct contact with the second portion surface; and
    annealing the preform in a furnace filled with oxygen-containing gas at an annealing temperature, so that the second portion is removed by oxidation and the first portion is remained on the substrate to form the patterned 2D TMDs nanomaterials.

2. The method of claim 1, wherein the substrate is made by:
    providing a base, wherein the base comprises a material selected from the group consisting of oxide, nitride and combination thereof, and
    applying a patterned mica layer on the base, wherein patterned mica layer defines a plurality of through holes so that part of the base is exposed to form the first portion surface, and the patterned mica layer defines the second portion surface.

3. The method of claim 2, wherein the base is a silicon plate coated with silicon dioxide, sapphire plate, quartz plate, or glass plate.

4. The method of claim 1, wherein the substrate is made by:
providing mica base; and
applying a patterned oxide layer or patterned nitride layer, wherein the patterned oxide layer or patterned nitride layer defines a plurality of through holes so that part of the mica base is exposed to form the second portion surface, and the patterned oxide layer or patterned nitride layer defines the first portion surface.

5. The method of claim 1, wherein the oxide is metal oxide.

6. The method of claim 5, wherein the metal oxide is selected from the group consisting of alumina, titanium dioxide, magnesium oxide and combination thereof.

7. The method of claim 1, wherein the oxide is inorganic nonmetal oxide.

8. The method of claim 7, wherein the inorganic nonmetal oxide is selected from the group consisting of silicon dioxide, boron oxide and combination thereof.

9. The method of claim 1, wherein the nitride is metal nitride.

10. The method of claim 9, wherein the nitride is metal nitride is selected from the group consisting of titanium nitride, aluminum nitride, gallium nitride, magnesium nitride and combination thereof.

11. The method of claim 1, wherein the nitride is inorganic nonmetal nitride.

12. The method of claim 11, wherein the inorganic nonmetal nitride is selected from the group consisting of silicon nitride, boron nitride and combination thereof.

13. The method of claim 1, wherein the single layer 2D TMDs nanomaterials is a single molybdenum disulfide ($MoS_2$) sheet, a single tungsten disulfide ($WS_2$) sheet, a single molybdenum selenide ($MoSe_2$) sheet, a single tungsten diselenide ($WSe_2$) sheet, a single molybdenum telluride ($MoTe_2$) sheet, or a single tungsten telluride ($WTe_2$) sheet.

14. The method of claim 1, wherein the single layer 2D TMDs nanomaterials is a single molybdenum disulfide sheet; the first portion surface is formed by silicon dioxide; the oxygen-containing gas is air at atmospheric pressure; and the annealing temperature ranges from about 250° C. to about 270° C.

15. The method of claim 1, wherein the single layer 2D TMDs nanomaterials is a single molybdenum disulfide sheet; the first portion surface is formed by alumina; the oxygen-containing gas is air at atmospheric pressure; and the annealing temperature ranges from about 250° C. to about 290° C.

16. The method of claim 1, wherein the single layer 2D TMDs nanomaterials is a single molybdenum disulfide sheet; the first portion surface is formed by silicon dioxide; the oxygen-containing gas is air at a pressure of 10 KPa; and the annealing temperature ranges from about 270° C. to about 300° C.

17. A method for making patterned two dimensional (2D) transition metal dichalcogenides (TMDs) nanomaterials, the method comprising:
applying a mask on a substrate, wherein the substrate comprises a material selected from the group consisting of metal oxide, inorganic nonmetal oxide, metal nitride, and inorganic nonmetal nitride;
etching the substrate via the mask to form a plurality of grooves;
applying a continuous mica layer on the substrate to cover both the substrate and the mask;
removing the mask and portion of the continuous mica layer, that is on the mask, to form a patterned mica layer, so that part of the surface of the substrate is exposed to form an exposed surface;
placing a single layer 2D TMDs nanomaterials on the substrate to cover the patterned mica layer to form a preform, wherein the single layer 2D TMDs nanomaterials comprises a first portion located on and in direct contact with the patterned mica layer and a second portion located on and in direct contact with the exposed surface of the substrate; and
annealing the preform in a furnace, so that the first portion of the single layer 2D TMDs nanomaterials is removed by oxidation and the second portion of the single layer 2D TMDs nanomaterials is remained on the substrate to form the patterned 2D TMDs nanomaterials.

18. The method of claim 17, wherein the single layer 2D TMDs nanomaterials is a single molybdenum disulfide sheet; the substrate is a silicon dioxide substrate, a sapphire substrate, or a quartz substrate; the furnace is filled with air at atmospheric pressure; and the annealing temperature ranges from 250° C. to about 290° C.

19. A method for making patterned two dimensional (2D) transition metal dichalcogenides (TMDs) nanomaterials, the method comprising:
making a continuous mica layer on a surface of a metal sheet;
applying a mask on a surface of the continuous mica layer;
etching the continuous mica layer via the mask to form a patterned mica layer;
depositing a continuous supporting layer on the metal sheet to cover both the metal sheet, the patterned mica layer, and the mask, wherein the continuous supporting layer comprises a material selected from the group consisting of metal oxide, inorganic nonmetal oxide, metal nitride, and inorganic nonmetal nitride;
removing the mask and portion of the continuous supporting layer, that is on the mask, to form a patterned supporting layer;
placing a single layer 2D TMDs nanomaterials on the metal sheet to cover both the patterned mica layer and the patterned supporting layer to form a preform, the single layer 2D TMDs nanomaterials comprises a first portion located on and in direct contact with the patterned mica layer and a second portion located on and in direct contact with the patterned supporting layer; and
annealing the preform in a furnace, so that the first portion of the single layer 2D TMDs nanomaterials is removed by oxidation, and the second portion of the single layer 2D TMDs nanomaterials is remained on the patterned supporting layer to form the patterned 2D TMDs nanomaterials.

20. The method of claim 19, wherein the single layer 2D TMDs nanomaterials is a single molybdenum disulfide sheet; the continuous supporting layer is a silicon dioxide layer, a sapphire layer, or a quartz layer; the furnace is filled with air at atmospheric pressure; and the annealing temperature ranges from 250° C. to about 270° C.

* * * * *